United States Patent
Lee et al.

(10) Patent No.: US 10,403,845 B2
(45) Date of Patent: Sep. 3, 2019

(54) TOP-EMISSIVE ORGANIC LIGHT-EMITTING DIODE DISPLAY

(71) Applicant: LG Display Co., Ltd., Seoul (KR)

(72) Inventors: Jaesung Lee, Paju-si (KR); Joonsuk Lee, Paju-si (KR); Seungwon Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/188,820

(22) Filed: Nov. 13, 2018

(65) Prior Publication Data

US 2019/0198799 A1    Jun. 27, 2019

(30) Foreign Application Priority Data

Dec. 27, 2017    (KR) .......................... 10-2017-0181345

(51) Int. Cl.
*H01L 29/08* (2006.01)
*H01L 51/52* (2006.01)
*H01L 27/32* (2006.01)

(52) U.S. Cl.
CPC ...... *H01L 51/5228* (2013.01); *H01L 27/3223* (2013.01); *H01L 27/3246* (2013.01); *H01L 27/3248* (2013.01); *H01L 27/3262* (2013.01); *H01L 51/5237* (2013.01); *H01L 51/5284* (2013.01); *H01L 2227/323* (2013.01); *H01L 2251/5315* (2013.01)

(58) Field of Classification Search
USPC .............................................. 257/40, 59, 72
See application file for complete search history.

(56) References Cited

U.S. PATENT DOCUMENTS

2016/0233458 A1*    8/2016    Shen ................... H01L 51/5228

FOREIGN PATENT DOCUMENTS

KR    10-2016-0127459 A    11/2016
KR    10-2017-0015829 A    2/2017

* cited by examiner

*Primary Examiner* — Tan N Tran
(74) *Attorney, Agent, or Firm* — Fenwick & West LLP

(57) ABSTRACT

A top-emissive organic light-emitting diode display includes a substrate, an auxiliary line, an insulating film, an auxiliary cathode, a passivation film, a planarization film, an under-cut opening, an under-area, a connecting terminal, an organic emission layer, and a cathode. An under-cut opening exposes one end of the auxiliary cathode. The under-area is formed inside the under-cut opening by removing the insulating film underlying the exposed end of the auxiliary cathode. The connecting terminal on the planarization film extends to the under-cut opening and makes contact with the exposed auxiliary cathode. The organic emission layer is stacked on the surface of the auxiliary cathode, and is not applied to the under-area and exposes the side of the connecting terminal making contact with the auxiliary cathode. The cathode is stacked on the organic emission layer and makes contact with the side of the connecting terminal not covered by the organic emission layer.

20 Claims, 11 Drawing Sheets

TOP-EMISSIVE ORGANIC LIGHT-EMITTING DIODE DISPLAY

This application claims the benefit of Republic of Korea Patent Application No. 10-2017-0181345 filed on Dec. 27, 2017, which is incorporated herein by reference in its entirety.

BACKGROUND

Field of the Disclosure

The present disclosure relates to a top-emissive organic light-emitting diode display. More particularly, the present disclosure relates to a top-emissive organic light-emitting diode display that comprises an auxiliary cathode for reducing the surface resistance of a cathode and has an under-cut structure configured to directly connect the auxiliary electrode and the cathode.

Related Art

Recently, various flat-panel displays that are less bulky and more lightweight than cathode ray tubes (CRTs) are being developed. Examples of these flat panel displays include liquid crystal displays (LCDs), field emission displays (FEDs), plasma display panels (PDPs), electroluminescence devices (ELs), etc.

Electroluminescence displays are roughly classified into inorganic electroluminescence displays and organic light-emitting diode displays depending on the materials used for an emissive layer, and offer several advantages such as fast response time, high light-emission efficiency, high brightness, and wide viewing angle because of their self-emissive elements. Notably, there is a rapidly increasing demand for organic light-emitting diode displays, which have high energy efficiency and less leakage current and facilitate grayscale representation through current control.

In an organic light-emitting diode display, a cathode with a base voltage is applied across the entire surface of a display panel. Although there is no problem when the cathode is made of a metal material with low resistivity, there may be problems with image quality if the cathode is made of a transparent conductive material, due to its high surface resistance.

For example, the surface resistance increases if the cathode comprises a transparent conductive material or a material that has a higher resistivity than metals, such as indium tin oxide or indium zinc oxide, as in top-emissive displays. As a result, the voltage of the cathode may not be constant across the entire area of the display panel. The uneven brightness of the display device across the entire screen may become a more important issue, especially in the development of large-area organic light-emitting diode displays.

SUMMARY OF THE DISCLOSURE

The present disclosure has been made in an effort to overcome the aforementioned problems, and an aspect of the present disclosure is to provide a large-area organic light-emitting diode display that has good display quality because the surface resistance is low due to direct contact between a cathode and an auxiliary cathode. Another aspect of the present disclosure is to provide a large-area organic light-emitting diode display that comprises an auxiliary cathode and simplifies the manufacturing process.

An exemplary embodiment of the present disclosure provides an organic light-emitting diode comprising a substrate, an auxiliary line, an insulating film, an auxiliary cathode, a passivation film, a planarization film, an under-cut opening, an under-area, a connecting terminal, an organic emission layer, and a cathode. The auxiliary line is placed on the substrate. The insulating film covers the auxiliary line. The auxiliary cathode is placed on the insulating film and connected to the auxiliary line. The passivation film covers the auxiliary cathode. The planarization film is stacked on the passivation film. The under-cut opening exposes one end of the auxiliary cathode. The under-area is formed inside the under-cut opening by removing the insulating film underlying the exposed end of the auxiliary cathode. The connecting terminal on the planarization film extends to the under-cut opening and makes contact with the exposed auxiliary cathode. The organic emission layer is stacked on the surface of the auxiliary cathode, and is not applied to the under-area and exposes the side of the connecting terminal making contact with the auxiliary cathode. The cathode is stacked on the organic emission layer and makes contact with the side of the connecting terminal not covered by the organic emission layer.

In this embodiment, the under-cut opening comprises: one side where the sidewalls of the planarization film, passivation film, and insulating film are etched; and the other side that exposes the one end of the auxiliary cathode, where the under-area is formed under the exposed end.

In this embodiment, the organic light-emitting diode display further comprises a dummy connecting terminal that is placed in the under-area and makes direct contact with the cathode.

In this embodiment, the organic light-emitting diode display further comprises: a light shielding layer on the substrate that lies on the same level as the auxiliary line; a thin-film transistor on the light shielding layer that lies under the passivation film; a pixel contact hole that is formed in the planarization film and exposes part of the thin-film transistor; a bank that exposes the entire under-cut opening in a larger size than the under-cut opening and opens a light-emitting area exposing the center of the anode; and an anode on the planarization film that is connected to the thin-film transistor via the pixel contact hole, wherein the organic emission layer is applied over the entire light-emitting area, the cathode is stacked on the organic emission layer in the light-emitting area, and the anode, the organic emission layer, and the cathode overlap to form an organic light-emitting diode in the light-emitting area.

In this embodiment, the connecting terminal comprises the same material as the anode.

In this embodiment, the organic light-emitting diode display further comprises: a buffer layer that covers the light shielding layer and the auxiliary line and is stacked under the insulating film; and a drain electrode of the thin-film transistor that lie over the insulating film, wherein the auxiliary cathode is formed on the insulating film and comprises the same material as the drain electrode.

In this embodiment, in the under-cut opening, the one end of the auxiliary cathode, the side of the connecting terminal, and the cathode are physically and electrically connected by coming into direct contact with one another.

The organic light-emitting diode display according to the present disclosure is provided as a large-area organic light-emitting diode display in which an auxiliary cathode is formed by using a shielding layer for protecting a metal oxide semiconductor material from light coming from the outside. The auxiliary cathode and the cathode may be physically and electrically connected, without an additional mask process, by forming an under-cut structure in a passivation film patterning process. The present disclosure provides a large-area organic light-emitting diode display because of its structure capable of reducing the resistance of the cathode. Moreover, the manufacturing time and costs can be reduced by reducing the number of mask processes.

Another exemplary embodiment of the present disclosure provides an organic light-emitting diode comprising a thin-film transistor on a substrate, an organic light-emitting diode in a light-emitting area of the substrate, the organic light-emitting diode including a cathode electrode, an auxiliary line on the substrate, an auxiliary cathode electrically connected to the auxiliary line, a passivation film on the substrate, at least a first part of the passivation film covering a portion of the auxiliary cathode to expose an end portion of the auxiliary cathode extending beyond the first part of the passivation film, and a connecting terminal on the passivation film that contacts the end portion of the auxiliary cathode and is electrically connected to at least a first part of the cathode electrode.

In one embodiment, an insulating film on the substrate has at least a first part of the insulating film disposed below auxiliary cathode to expose the end portion of the auxiliary cathode.

In one embodiment, the connecting terminal contacts an undersurface of the auxiliary cathode that faces the substrate and the first part of the cathode electrode contacts the connecting terminal.

In one embodiment, a dummy connecting terminal placed below the end portion of the auxiliary cathode contacts the first part of the cathode electrode.

In one embodiment, the insulation film is formed with a contact hole to form the first part of the insulation film and a second part of the insulation film adjacent to the first part of the insulation film, and at least a second part of the cathode electrode extends to cover a side surface of the second part of the insulation film and contacts the dummy connecting terminal.

In one embodiment, an organic emission layer is disposed between the connecting terminal and the cathode electrode, where the organic emission layer does not contact the auxiliary cathode.

In one embodiment, a planarization layer is disposed on the passivation film, and a bank layer is disposed on the planarization layer, where the connecting terminal covers a side surface of the planarization layer and at least a portion of the connecting terminal is disposed between the planarization layer and the bank layer.

In one embodiment, a light shielding layer on the substrate is in a same layer as the auxiliary line. A thin-film transistor on the light shielding layer is disposed under the passivation film, where the organic light-emitting diode comprises an anode electrically connected to the thin-film transistor, and the anode is in a same layer as the connecting terminal. An organic emission layer is over the anode in the light emitting layer and at least a second part of the cathode electrode is stacked on the organic emission layer.

In one embodiment, a buffer layer covers the light shielding layer and the auxiliary line and is disposed under the insulating film, where the thin-film transistor includes a drain electrode on the insulating film, and the auxiliary cathode is disposed on the insulating film in a same layer as the drain electrode.

In one embodiment, a side surface of the end portion of the auxiliary cathode contacts the connecting terminal, and the cathode electrode contacts the connecting terminal, and the cathode electrode contacts the connecting terminal.

In one embodiment, the auxiliary line, the auxiliary cathode, and the connecting terminal are placed in a non-light emitting area surrounding the light-emitting area, and the organic light-emitting diode in the light-emitting area and the auxiliary line are electrically connected.

Another exemplary embodiment of the present disclosure provides an organic light-emitting diode display that includes a thin-film transistor on a substrate, an organic light-emitting diode in a light-emitting area of the substrate, the organic light-emitting diode including at least a part of a cathode electrode, an auxiliary line on the substrate, an insulating film on the substrate, an auxiliary cathode placed on the insulating film and electrically connected to the auxiliary line, a passivation film on the substrate, at least a first part of the passivation film covering a portion of the auxiliary cathode, and a connecting terminal on the passivation film that contacts an undersurface of the auxiliary cathode, that faces the substrate and is electrically connected to the cathode electrode.

In one embodiment, a first opening in the insulating film and a second opening in the passivation film exposes an end portion of the auxiliary cathode extending beyond the first part of the passivation film.

In one embodiment, a dummy connecting terminal that makes direct contact with the connecting terminal on the undersurface.

In one embodiment, the insulation film is formed with a contact hole to form the first part of the insulation film and a second part of the insulation film adjacent to the first part of the insulation film, and at least another part of the cathode electrode extends to cover a side surface of the second part of the insulation film and contacts the dummy connecting terminal.

In one embodiment, an organic emission layer is disposed between the connecting terminal and the cathode electrode, and the organic emission layer does not contact the auxiliary cathode.

In one embodiment, a planarization layer is disposed on the passivation film, a bank layer is disposed on the planarization layer, and the connecting terminal covers a side surface of the planarization layer and at least a portion of the connecting terminal is disposed between the planarization layer and bank layer.

In one embodiment, a light shielding layer is on the substrate in a same layer as the auxiliary layer, a thin-film transistor is on the light shielding layer disposed under the passivation film, and the organic light-emitting diode further includes an anode electrically connected to the thin-film transistor, where the anode is in a same layer as the connecting terminal, an organic emission layer over the anode in the light emitting area, and at least a part of the cathode electrode stacked on the organic emission layer.

In one embodiment, a buffer layer that covers the light shielding layer and the auxiliary line and disposed under the insulating film, the thin-film transistor includes a drain electrode on the insulating film, and the auxiliary cathode is disposed on the insulating film in a same layer as the drain electrode.

In one embodiment, the auxiliary line, the auxiliary cathode, and the connecting terminal are placed in a non-light emitting area surrounding the light-emitting area, and the organic light-emitting diode in the light-emitting area and the auxiliary line are electrically connected.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

DESCRIPTION OF EXEMPLARY EMBODIMENTS

Figure 1:
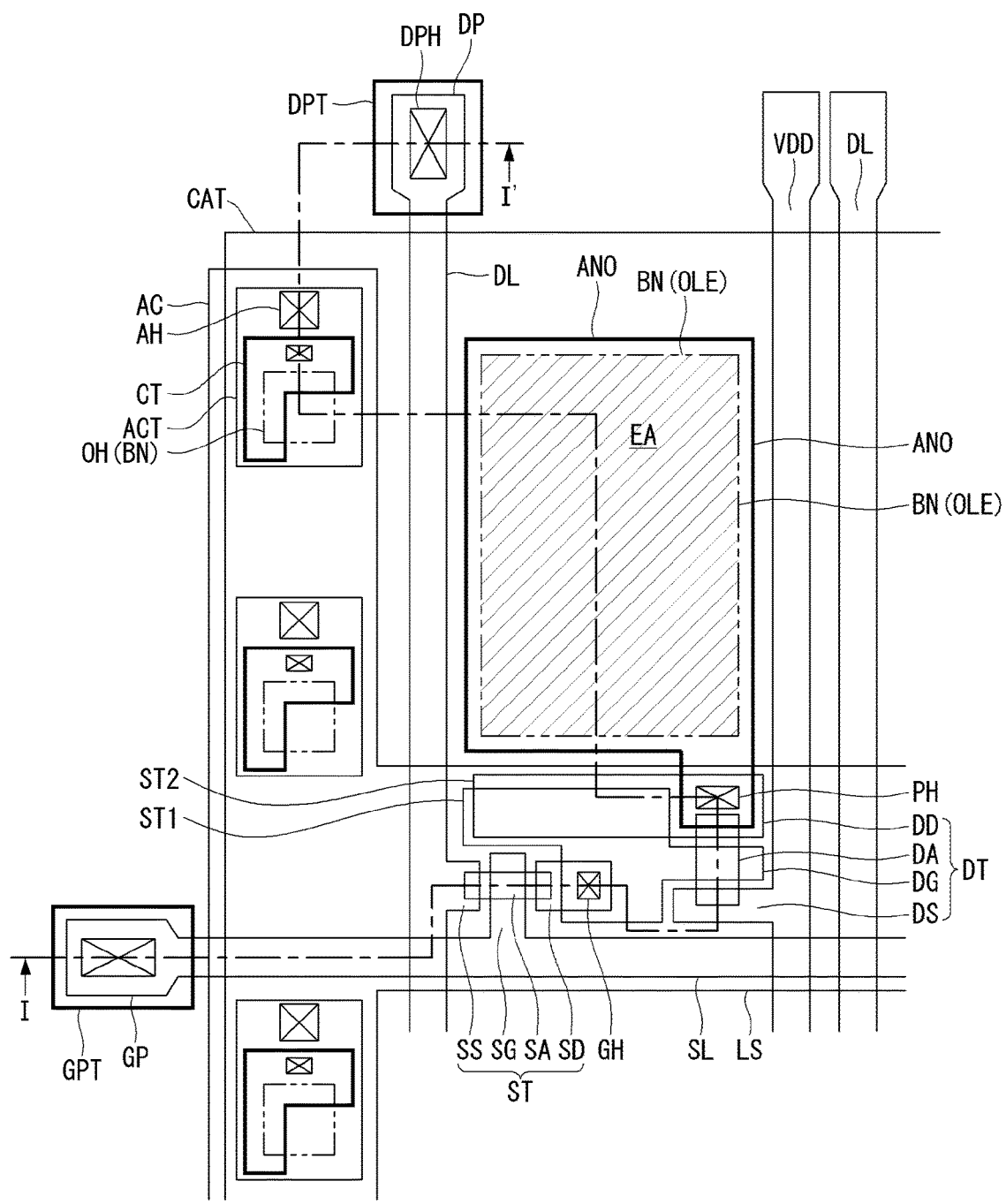
FIG. 1 is a plan view of a structure of an organic light-emitting diode display according to the present disclosure.

Various aspects and features of the present disclosure and methods of accomplishing them may be understood more readily by reference to the following detailed descriptions of exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the present disclosure to those skilled in the art, and the present disclosure is defined by the appended claims.

The shapes, sizes, proportions, angles, numbers, etc. shown in the figures to describe the exemplary embodiments of the present disclosure are merely examples and not limited to those shown in the figures. Like reference numerals denote like elements throughout the specification.

In describing the present disclosure, detailed descriptions of related well-known technologies will be omitted to avoid unnecessary obscuring the present disclosure. When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated. When the position relation between two parts is described using the terms "on", "over", "under", "next to" and the like, one or more parts may be positioned between the two parts as long as the term "immediately" or "directly" is not used.

It will be understood that, although the terms "first", "second", etc. may be used herein to describe various elements, these elements are not limited by these terms. These terms are used to distinguish one element from another element. The terms and names of elements used herein are chosen for ease of description and may be different from the names of parts used in actual products.

The features of various exemplary embodiments of the present disclosure may be coupled or combined with one another either partly or wholly, and may technically interact or work together in various ways. The exemplary embodiments may be carried out independently or in connection with one another.

Hereinafter, exemplary embodiments of the present disclosure will be described in detail with reference to the accompanying drawings. In the exemplary embodiments below, the description of an electroluminescence display will focus on an organic light-emitting display comprising organic light-emitting material. However, it should be noted that the technical idea of the present disclosure is not limited to organic light-emitting displays but also may apply to inorganic light-emitting displays comprising inorganic light-emitting material.

Figure 2:
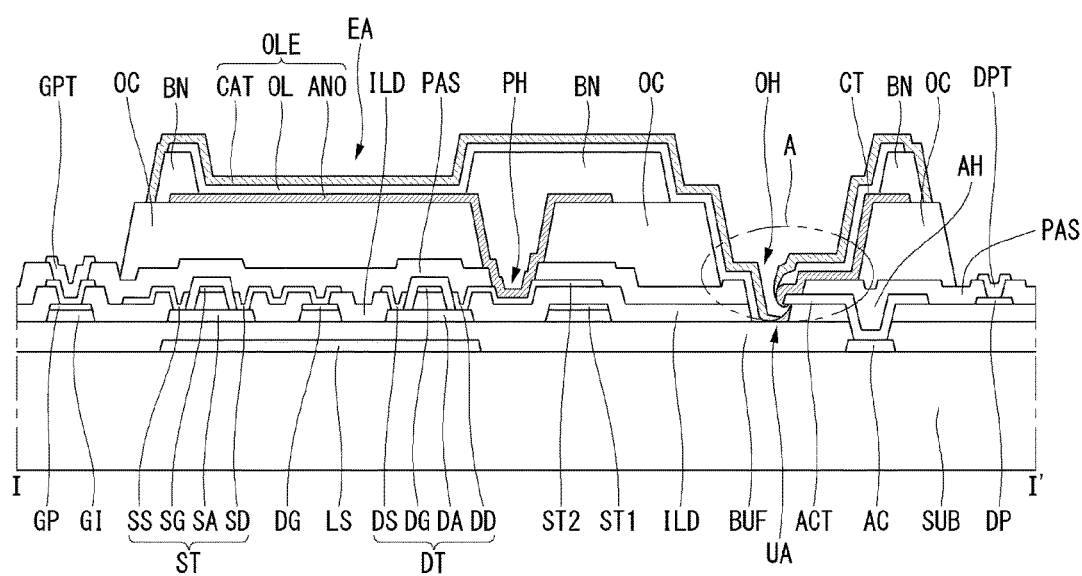
FIG. 2 is a cross-sectional view of the organic light-emitting diode display according to the first exemplary embodiment of the present disclosure, taken along the line I-I' in FIG. 1.

Hereinafter, a structure of an organic light-emitting diode display according to a first exemplary embodiment of the present disclosure will be described with reference to FIGS. 1 and 2. FIG. 1 is a plan view of a structure of an organic light-emitting diode display according to the present disclosure. FIG. 2 is a cross-sectional view of the organic light-emitting diode display according to the first exemplary embodiment of the present disclosure, taken along the line I-I' in FIG. 1.

The organic light-emitting diode display according to the present disclosure comprises a plurality of pixel regions arranged in a matrix on a substrate SUB. The organic light-emitting diode display comprises a scan line SL that runs horizontally on the substrate SUB and a data line DL and a drive current line VDD that run vertically on the substrate SUB. The pixel regions are defined by the intersections of the scan line SL, data line DL, and drive current line VDD. The scan lines SL is connected to a gate pad terminal GPT and the data lines DL is connected to a data pad terminal DPT. The gate terminal GPT has a gate pad GP and a gate pad contact hole GPH and the data pad terminal DPT has a data pad DP and a data pad contact hole DPH. For example, the gate pad terminal GPT and data pad terminal DPT are formed of a metal oxide such as ITO or IZO but not limit thereto.

In each pixel region, an organic light-emitting diode OLE and thin-film transistors, which are driving elements for driving the organic light-emitting diode OLE, are placed. The thin-film transistors comprise a switching thin-film transistor ST and a driving thin-film transistor DT. The switching thin-film transistor ST comprises a switching gate electrode SG, a switching semiconductor layer SA, a switching source electrode SS, and a switching drain electrode SD. The switching gate electrode SG is connected to the scan line SL. The switching semiconductor layer SA and the central area of the switching gate electrode SG overlap each other, with a gate insulating film GI between them. The switching source electrode SS and the switching drain electrode SD are placed on either side of the switching gate electrode SG, and are connected to one side and the other side of the switching semiconductor layer SA, respectively.

The driving thin-film transistor DT comprises a driving gate electrode DG, a driving semiconductor layer DA, a driving source electrode DS, and a driving drain electrode DD. The driving gate electrode DG is connected to the switching drain electrode SD. The driving semiconductor layer DA and the central area of the driving gate electrode DG overlap each other, with the gate insulating film GI between them. The driving source electrode DS and the driving drain electrode DD are placed on either side of the driving gate electrode DG, and are connected to one side and the other side of the driving semiconductor layer DA, respectively.

The organic light-emitting diode OLE comprises an anode ANO, an organic emission layer OL, and a cathode CAT. The anode ANO is connected to the driving thin-film transistor DT. The organic emission layer OL is stacked on the anode ANO. Particularly, a light-emitting area EA is defined in the anode ANO by a bank BN. The organic emission layer OL is applied to the entire surface of the substrate SUB, and makes contact with the anode ANO in the light-emitting area EA. The cathode CAT also is applied onto the entire surface of the substrate SUB. In the light-emitting area EA, the anode ANO, the organic emission layer OL, and the cathode CAT are sequentially stacked to form the organic light-emitting diode OLE.

In the case of a top-emissive organic light-emitting diode display, light is directed from the anode ANO toward the cathode CAT in FIG. 2. Thus, it is desirable that the anode ANO comprises an opaque metal material and the cathode CAT comprises a transparent conductive material. The cathode CAT is an electrode that maintains a base voltage in the organic light-emitting diode OLE, and preferably may maintain a constant voltage. If the cathode CAT comprises a transparent conductive material, such as indium tin oxide or indium zinc oxide, which has a much higher resistivity than metals, it is difficult to maintain a constant base voltage in a large-area organic light-emitting diode display. Thus, it is desirable to reduce surface resistance by forming an auxiliary line AC and/or an auxiliary cathode ACT from metal material and connecting them to the cathode CAT.

To this end, in the present disclosure, the organic light-emitting diode display further comprises an auxiliary line AC, an auxiliary cathode ACT, and a connecting terminal CT that are placed in a non-light-emitting area surrounding the light-emitting area EA. The auxiliary line AC may be made of the same metal material on the same level as a light shielding layer LS that lies under the thin-film transistors ST and DT. The auxiliary cathode ACT may be made of the same material on the same level as the source and drain electrodes of the thin-film transistors ST and DT. The connecting terminal CT may be made of the same material on the same level as the anode ANO.

The auxiliary line AC may be formed separately from the light shielding layer LS, or may be connected to the light shielding layer LS to form a mesh pattern on the substrate SUB. A buffer layer BUF is applied over the auxiliary line AC. The auxiliary cathode ACT may be made of the same material on the same level as the source and drain electrodes of the thin-film transistors ST and DT formed on the buffer layer BUF, but separately from them. In this case, the auxiliary cathode ACT is connected to the auxiliary line AC via an auxiliary line contact hole AH formed through an interlayer insulating film ILD and the buffer layer BUF which are stacked under the source and drain electrodes. In some embodiments, the auxiliary cathode ACT may be electrically connected to the auxiliary line AC.

A passivation film PAS is deposited on at least a portion of the auxiliary cathode ACT. A planarization film OC is deposited on the passivation film PAS. The anode ANO and the connecting terminal CT are formed on the planarization film OC. The auxiliary cathode ACT and the connecting terminal CT may be physically connected to each other, directly or indirectly. Here, it is assumed that they are connected directly. The connecting terminal CT is connected to the auxiliary cathode ACT via an under-cut opening OH formed by partially etching the planarization film OC, the passivation film PAS, and the interlayer insulating film ILD.

Moreover, the under-cut opening OH formed through the planarization film OC, the passivation film PAS, and the interlayer insulating film ILD exposes part of the auxiliary cathode ACT. The under-cut opening OH exposes an end portion of the auxiliary cathode ACT that extends beyond the passivation film PAS. The connecting terminal CT contacts an undersurface of the auxiliary cathode ACT that faces the substrate SUB. One side of the under-cut opening OH exposes sidewalls of the planarization film OC, passivation film PAS, and interlayer insulating film ILD. The other side of the under-cut opening OH exposes the end of the connecting terminal CT. The connecting terminal CT is exposed through the other side of the under-cut opening OH in order to form an under-area UA by overetching the interlayer insulating film ILD stacked under the connecting terminal CT by using the connecting terminal CT.

The under-cut opening OH may have a polygonal shape. For convenience of explanation, the under-cut opening OH in FIG. 1 has a rectangular shape, but not limited to it. For example, the under-cut opening OH may have two opposite sides. On one of the two opposite sides, the etched sidewall of the planarization film OC, the etched sidewall of the passivation film PAS, and the etched sidewall of the interlayer insulating film ILD are exposed. On the other side, the connecting terminal CT is exposed, and the under-area UA is formed by overetching the interlayer insulating film ILD lying under the connecting terminal CT.

The passivation film PAS and interlayer insulating film ILD in the under-cut opening OH are removed. Particularly, on the other side of the under-cut opening OH, part of the interlayer insulating film ILD stacked under the connecting terminal CT is overetched, thereby exposing part of the undersurface of the connecting terminal CT. A cave-like space in the under-cut opening OH, formed by overetching the interlayer insulating film ILD under the connecting terminal CT, is defined as the under-area UA.

Figure 3:
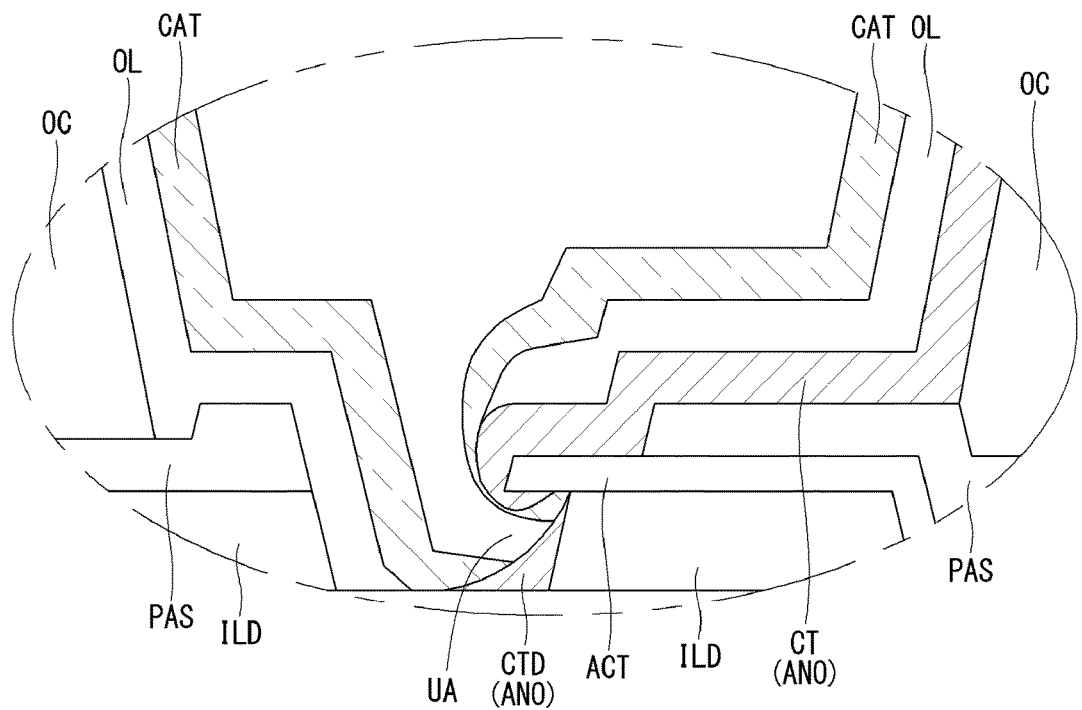
FIG. 3 is an enlarged cross-sectional view of a structure of the under-cut opening of FIG. 2 where the cathode and auxiliary cathode are connected.

The under-area UA is formed by removing the interlayer insulating film ILD, and exposes part of the auxiliary cathode ACT, with its top being blocked by the auxiliary cathode ACT and the connecting terminal CT so as to prevent the organic emission layer OL from being applied to the under-area UA. On the other hand, when the connecting terminal CT is formed by depositing the anode ANO, the connecting terminal CT is deposited all the way into the under-area UA. Moreover, the cathode CAT also is deposited all the way into the under-area UA, coming into direct contact with the auxiliary cathode ACT and the connecting terminal CT. An enlarged view of the connecting structure of the cathode CAT and the auxiliary cathode ACT using the under-area UA is shown in FIG. 3. FIG. 3 is an enlarged cross-sectional view of the under-cut opening of FIG. 3 where the cathode and auxiliary cathode are connected.

The organic emission layer OL is not applied to the under-area UA blocked by the connecting terminal CT because it is an organic material heated and deposited by a thermal deposition technique. On the other hand, a metal oxide material such as ITO or IZO, is deposited by a sputtering technique, all the way to the under-area UA blocked by the connecting terminal CT.

Moreover, the organic emission layer OL is applied only to the top surface of the connecting terminal CT. On the other hand, the cathode CAT is deposited all the way to the underside of the connecting terminal CT blocking the under-area UA, and the connecting terminal CT is physically and electrically connected to the cathode CAT.

That is, in the under-cut opening of the organic light-emitting diode display according to the present disclosure, the cathode CAT is connected to the auxiliary cathode ACT and the connecting terminal CT. Also, the auxiliary cathode ACT is connected to the auxiliary line AC. Thus, the cathode CAT made of a transparent conductive material with high resistivity may have low surface resistance because the auxiliary cathode ACT and the auxiliary line AC are made of a metal material with very low resistivity.

Hereinafter, a manufacturing process of the organic light-emitting diode display according to the present disclosure will be described with reference to FIGS. 4A to 4K. FIGS.

4A to 4K are cross-sectional views of a manufacturing process of the organic light-emitting diode display according to the present disclosure.

Figure 4A:
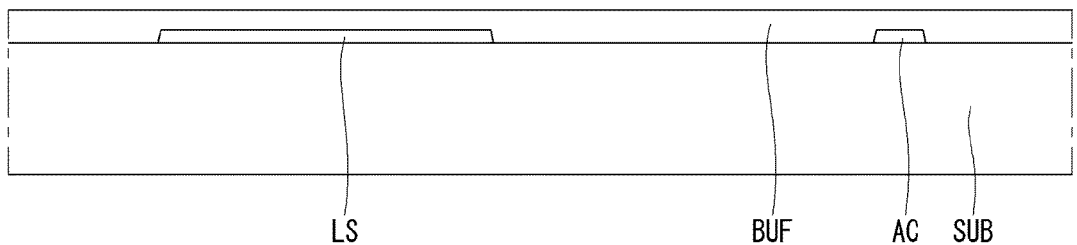
FIGS. 4A to 4K are cross-sectional views of some of the steps of a manufacturing process of the organic light-emitting diode display according to the present disclosure.

An opaque metal material is applied onto a substrate SUB. In a first mask process, the metal material is patterned to form a light shielding layer LS and an auxiliary line AC. A buffer layer BUF is formed over the entire surface of the substrate SUB where the light shielding layer LS and the auxiliary line AC are formed. The light shielding layer LS is placed where thin-film transistors are to be formed. For example, the light shielding layer LS may have the shape of a strip that runs horizontally across the substrate SUB. The auxiliary line AC may have the shape of a strip that runs horizontally or vertically across the substrate SUB. The auxiliary line AC may be disconnected from the light shielding layer LS or connected to it. Here, as shown in FIG. 1, the auxiliary line AC is illustrated as a line that is connected to the light shielding layer LS and runs vertically across the substrate SUB (FIG. 4A).

Figure 4B:
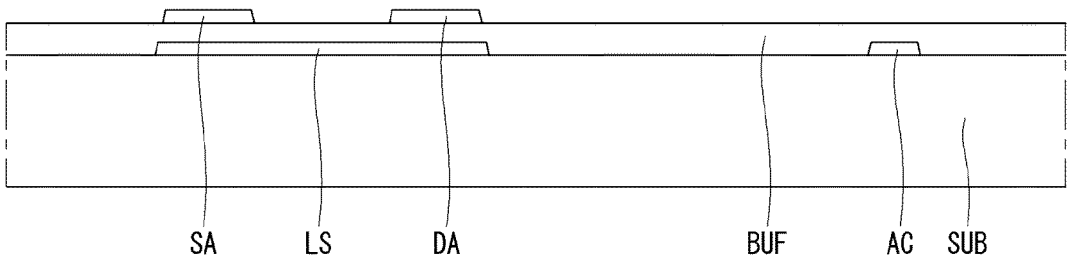

A semiconductor material is applied on the buffer layer BUF. In a second mask process, the semiconductor material is patterned to form a semiconductor layer. The semiconductor layer comprises a switching semiconductor layer SA of a switching thin-film transistor ST and a driving semiconductor layer DA of a driving thin-film transistor DT (FIG. 4B).

Figure 4C:
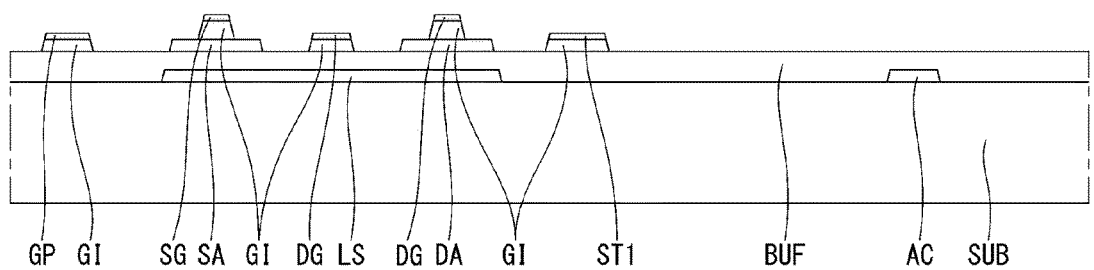

An insulating material layer and a metal material layer are deposited in a row over the entire surface of the substrate SUB where the semiconductor layers SA and DA are formed. In a third mask process, the metal material layer and the insulating material layer are patterned simultaneously to form a gate insulating film GI, a scan line SL, a gate pad GP, a first auxiliary capacitor electrode ST1, and gate electrodes. The gate electrodes comprise a switching gate electrode SG of the switching thin-film transistor ST and a driving gate electrode DG of the driving thin-film transistor DT. The switching gate electrode SG and the center of the semiconductor layer SA overlap each other, with the gate insulating film GI between the switching gate electrode SG and the semiconductor layer SA. The driving gate electrode DG and the center of the driving semiconductor layer DA overlap each other, with the gate insulating film GI between the driving gate electrode DG and the driving semiconductor layer DA (FIG. 4C).

Figure 4D:
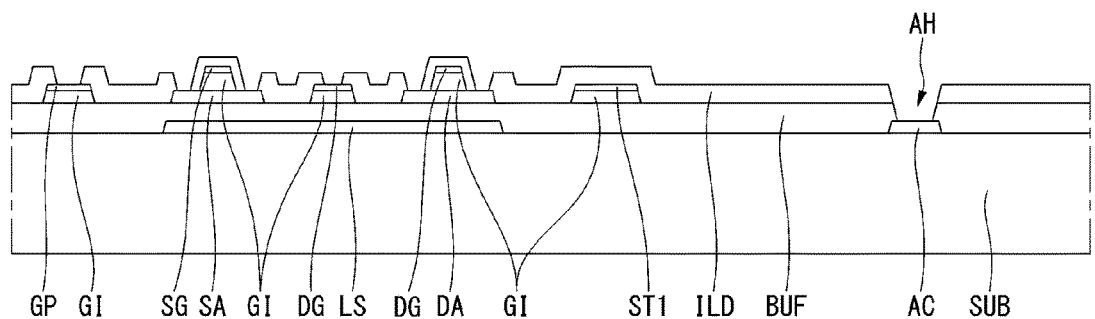

An interlayer insulating film ILD is applied over the entire surface of the substrate SUB where the scan line SL, the gate line GP, and the gate electrodes SG and DG are formed. In a fourth mask process, the interlayer insulating film ILD is patterned to form contact holes. The contact holes expose two opposite sides of the switching thin-film transistor ST and driving thin-film transistor DT. The two opposite sides are either side of the gate electrodes SG and DG of the semiconductor layers SA and DA. Also, they expose part of the driving gate electrode DG. Moreover, an auxiliary line contact hole AH is formed through the interlayer insulating film ILD and the buffer layer BUF to expose part of the auxiliary line AC (FIG. 4D).

Figure 4E:
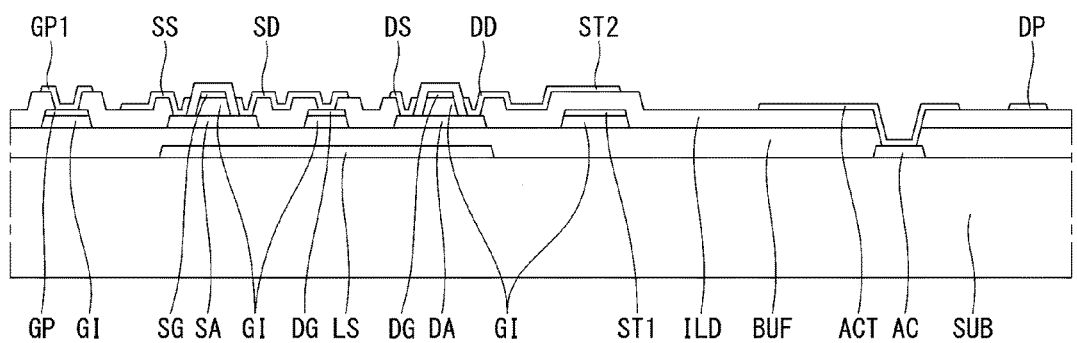

A metal material is applied on the interlayer insulating film ILD in which contact holes including the auxiliary line contact hole AH are formed. In a fifth mask process, the metal material is patterned to form a data line DL, a drive current line VDD, an auxiliary cathode ACT, a second auxiliary capacitor electrode ST2, and source and drain electrodes. The source and drain electrodes comprise a scan source electrode SS, a scan drain electrode SD, a driving source electrode DS, and a driving drain electrode DD. The scan source electrode SS is branched from the data line DL. The driving source electrode DS is branched from the driving current line VDD. A data pad DP is placed at the end of the data line DL, and a driving pad is placed at the end of the drive current line VDD. Also, a gate pad connecting terminal GP1 is formed at the gate pad GP. The second auxiliary capacitor electrode ST2 extends from the driving drain electrode DD, and overlaps the first auxiliary capacitor electrode ST1, with the interlayer insulating film ILD between them (FIG. 4E).

Figure 4F:
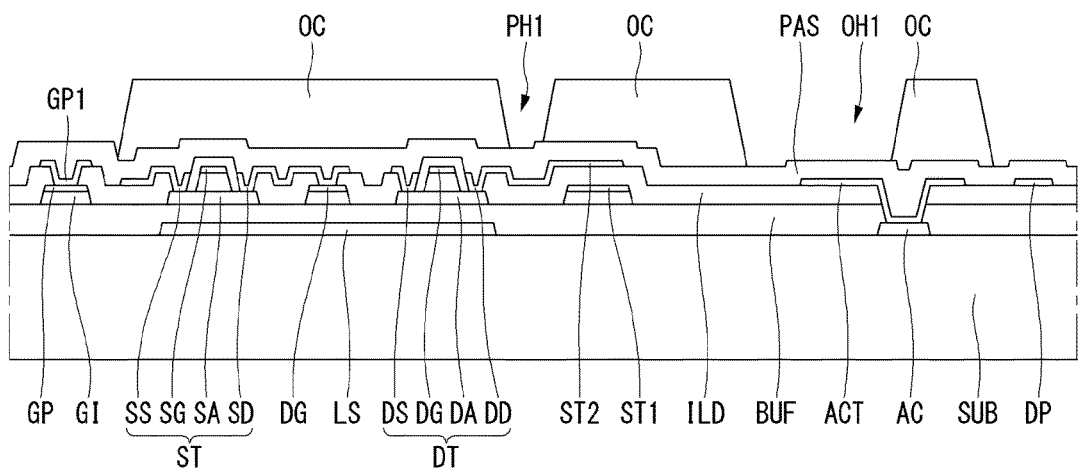

A passivation film PAS is applied over the entire surface of the substrate SUB where the source and drain electrodes are formed. Subsequently, a planarization film OC is applied on the passivation film PAS. In a sixth mask process, the planarization film OC is patterned to form a first pixel contact hole PH1 and a first under-cut opening OH1. In this instance, it is desirable that the planarization film OC in the area above the gate pad GP and data pad DP also is removed. The first under-cut opening OH1, which is a part for exposing the auxiliary cathode ACT, is preferably formed in the non-light-emitting area where the organic light-emitting diode is not placed (FIG. 4F).

Figure 4G:
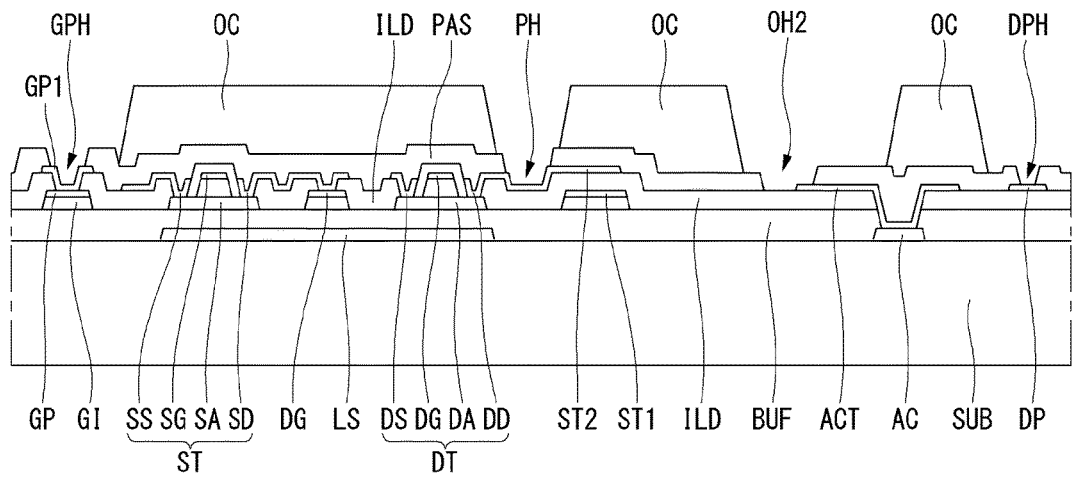

In a seventh mask process, the exposed passivation film PAS is patterned to form a gate pad contact hole GPH, a data pad contact hole DPH, a pixel contact hole PH, and a second under-cut opening OH2. The gate pad contact hole GPH exposes the gate pad connecting terminal GP1. The data pad contact hole DPH exposes the data pad terminal DP. The pixel contact hole PH exposes one end of the driving drain electrode DD. The second under-cut opening OH2 may be the same size as the first under-cut opening OH1. For convenience, the description will be given on the assumption that the second under-cut opening OH2 is a size small enough to fit into the first under-cut opening OH1 (FIG. 4G).

Figure 4H:
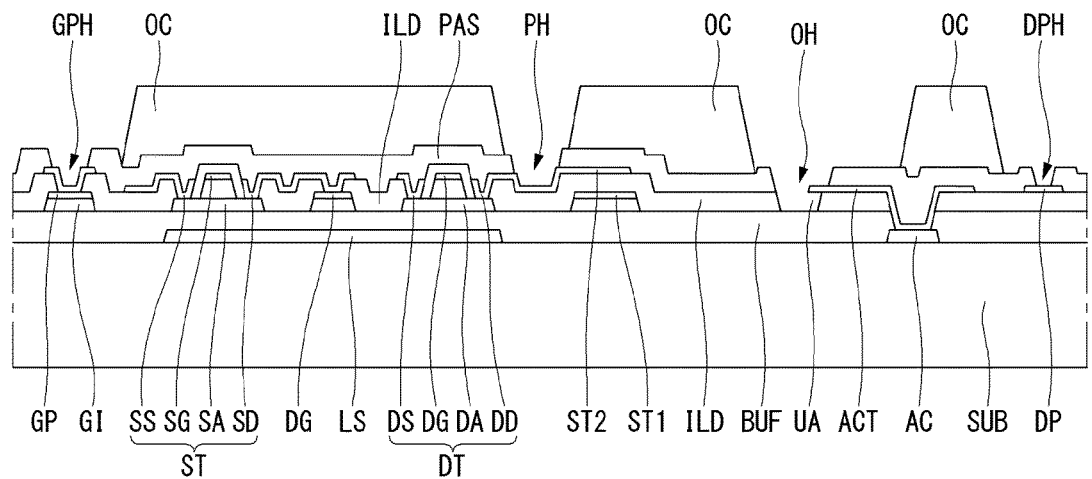

In the seventh mask process, after forming the contact holes GPH, DPH, and PH and the second under-cut opening OH2, the interlayer insulating film ILD exposed through the second under-cut opening OH2 is etched, thereby forming an under-cut opening OH. In this instance, the interlayer insulating film ILD is overetched only in the second under-cut opening OH2, since the interlayer insulating film ILD is not exposed through the contact holes GPH, DPH, and PH. Particularly, part of the end of the auxiliary cathode ACT is exposed through the second under-cut opening OH2, so only the underlying interlayer insulating film ILD is overetched, thereby forming an under-area UA. That is, an under-cut opening OH with the under-area UA is formed in the seventh mask process in which the passivation film PAS is patterned (FIG. 4H).

Figure 4I:
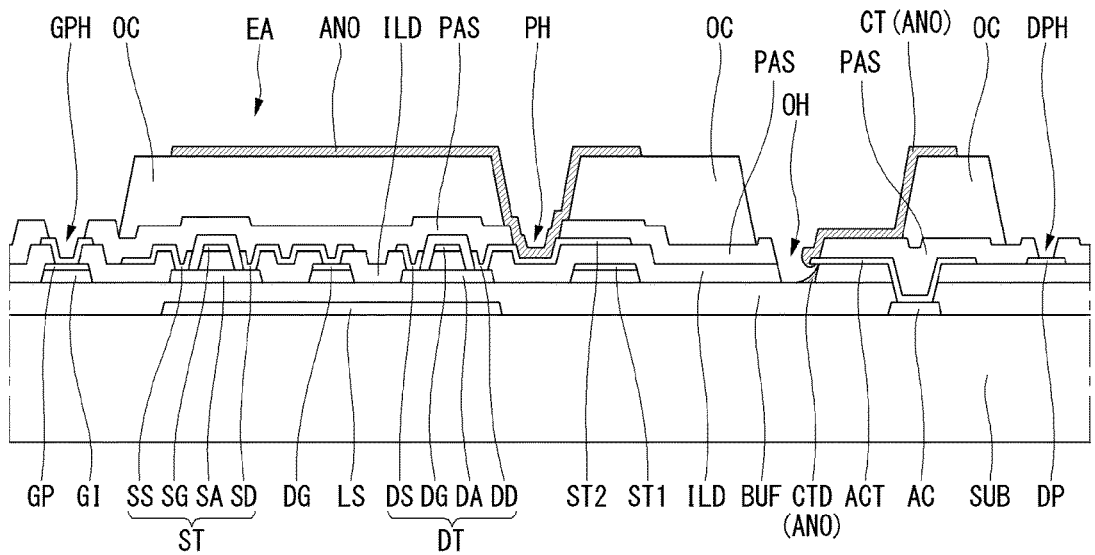

A metal material is deposited over the entire surface of the substrate SUB where the planarization film OC comprising the contact holes GPH, DPH, and PH and the under-cut opening OH is formed. In an eighth mask process, the metal material is patterned to form an anode ANO and a connecting terminal CT. The anode ANO is shaped to take up most of the center of the pixel region. The connecting terminal CT makes contact with one exposed part of the auxiliary cathode ACT via the under-cut opening OH. Moreover, the metal material is deposited in the under-area UA as well and left in the patterning process, thereby forming a dummy connecting terminal CTD. The dummy connecting terminal CTD may be formed on the sidewall of the under-area UA as well, and may be connected to the connecting terminal CT wrapping the exposed end of the auxiliary cathode ACT. In some cases, the dummy connecting terminal CTD may not be connected to the connecting terminal CT. On the side of the under-cut opening OH where the auxiliary cathode ACT is not formed, the connecting terminal CT is not placed but the etched sidewalls of the planarization film OC, passivation film PAS, and interlayer insulating film ILD are exposed. The connecting terminal CT is connected to the auxiliary cathode ACT exposed through the under-cut opening OH while coming into direct contact with it. The connecting terminal CT and the dummy connecting terminal CTD are made of the same material as the anode ANO (FIG. 4I).

Figure 4J:
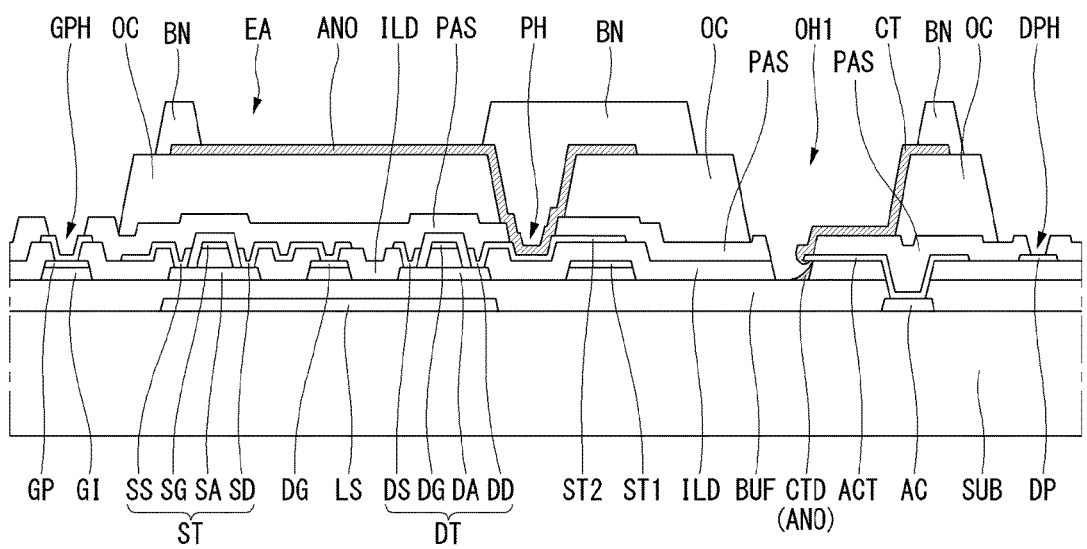

An organic material is applied over the entire surface of the substrate SUB where the anode ANO and the connecting terminal CT are formed. In a ninth mask process, the organic material is patterned to form a bank BN. The bank BN exposes most of the anode ANO and defines the light-emitting area EA. Also, the bank BN exposes the entire under-cut opening OH. That is, the bank BN has an open area smaller than the anode ANO and an open area larger than the under-cut opening OH (FIG. 4J).

An organic emission layer OL is applied over the entire surface of the substrate SUB where the bank BN is formed. The organic emission layer OL is an organic material that is applied by a thermal deposition process. The organic emission layer OL is applied to cover the surface of the bank BN and the top of the anode ANO. In the under-cut opening OH, the organic emission layer OL is applied over only some part of the exposed surface of the auxiliary cathode ACT. Particularly, in the under-area UA, the organic emission layer OL is not applied, but the side of the auxiliary cathode ACT is exposed directly. Particularly, a side portion of the connecting terminal CT, which is formed as if to wrap the exposed part of the auxiliary cathode ACT, is exposed, not covered by the organic emission layer OL. Also, the organic emission layer OL is not stacked on the dummy connecting terminal CTD formed in the under-area UA either.

After applying the organic emission layer OL, a transparent conductive material is then applied to form the cathode CAT. The transparent conductive material comprises indium tin oxide (ITO) or indium zinc oxide (IZO). The transparent conductive material is formed by a sputtering technique. In the light-emitting area EA, the cathode CAT is stacked on top of the anode ANO and the organic emission layer OL, thereby forming the organic light-emitting diode OLE.

Figure 4K:
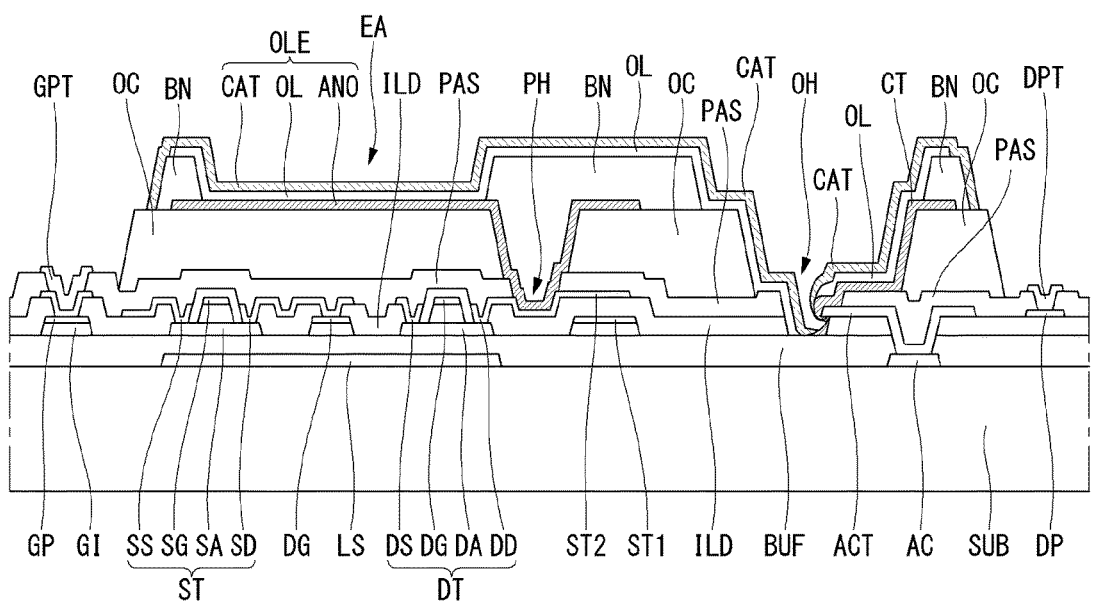

The cathode CAT deposited by the sputtering technique tends to be deposited along the bends on the surface. Also, the metal materials formed by the sputtering technique tend to accumulate one upon another as if the deposited particles grow. Thus, the cathode CAT is deposited in the area where the organic emission layer OL is not applied, as well as on the surface of the organic emission layer OL. That is, in the under-cut opening OH, the cathode CAT is deposited along the sloping surface on one side where the connecting terminal CT is not formed, and extends all the way to the under-area UA. As a result, the cathode CAT penetrates into the under-area UA where the organic emission layer OL is not applied, and covers the dummy connecting terminal CTD. Moreover, the cathode CAT comes into direct contact with the exposed side of the connecting terminal CT in the under-cut opening OH, which is not covered by the organic emission layer OL. Particularly, the cathode CAT extends as if to wrap the exposed part of the connecting terminal CT not covered by the organic emission layer OL, just like the connecting terminal CT is formed as if to wrap the exposed part of the auxiliary cathode ACT (FIG. 4K).

In the under-cut opening OH, the auxiliary cathode ACT, the connecting terminal CT, and the cathode CAT are sequentially brought into contact with one another. The auxiliary cathode ACT is connected to the auxiliary line AC via the auxiliary contact hole AH. As a result, the cathode CAT is connected to the auxiliary line AC made of low-resistivity material, thereby maintaining low surface resistance.

While the embodiment of the present disclosure has been described in detail with reference to the drawings, it will be understood by those skilled in the art that the disclosure can be implemented in other specific forms without changing the technical spirit or essential features of the disclosure. Therefore, it should be noted that the forgoing embodiments are merely illustrative in all aspects and are not to be construed as limiting the disclosure. The scope of the disclosure is defined by the appended claims rather than the detailed description of the disclosure. All changes or modifications or their equivalents made within the meanings and scope of the claims should be construed as falling within the scope of the disclosure.

What is claimed is:

1. An organic light-emitting diode display comprising:
   a thin-film transistor on a substrate;
   an organic light-emitting diode in a light-emitting area of the substrate, the organic light-emitting diode including at least a part of a cathode electrode;
   an auxiliary line on the substrate;
   an auxiliary cathode electrically connected to the auxiliary line;
   a passivation film on the substrate, at least a first part of the passivation film covering a portion of the auxiliary cathode to expose an end portion of the auxiliary cathode extending beyond the first part of the passivation film; and
   a connecting terminal on the passivation film that contacts the end portion of the auxiliary cathode and is electrically connected to the cathode electrode.

2. The organic light-emitting diode display of claim 1, further comprising:
   an insulating film on the substrate, at least a first part of the insulating film disposed below auxiliary cathode to expose the end portion of the auxiliary cathode.

3. The organic light-emitting diode display of claim 2, wherein the connecting terminal contacts an undersurface of the auxiliary cathode that faces the substrate, and wherein at least a first part of the cathode electrode contacts the connecting terminal.

4. The organic light-emitting diode display of claim 2, further comprising a dummy connecting terminal placed below the end portion of the auxiliary cathode, the dummy connecting terminal contacting at least a first part of the cathode electrode.

5. The organic light-emitting diode display of claim 4, wherein the insulation film is formed with a contact hole to form the first part of the insulation film and a second part of the insulation film adjacent to the first part of the insulation film, and
   wherein at least a second part of the cathode electrode extends to cover a side surface of the second part of the insulation film and contacts the dummy connecting terminal.

6. The organic light-emitting diode display of claim 1, further comprising an organic emission layer disposed between the connecting terminal and the cathode electrode, wherein the organic emission layer does not contact the auxiliary cathode.

7. The organic light-emitting diode display of claim 1, further comprising:
   a planarization layer disposed on the passivation film, and
   a bank layer disposed on the planarization layer, wherein the connecting terminal covers a side surface of the planarization layer and at least a portion of the connecting terminal is disposed between the planarization layer and the bank layer.

8. The organic light-emitting diode display of claim 1, further comprising:
a light shielding layer on the substrate in a same layer as the auxiliary line; and
a thin-film transistor on the light shielding layer disposed under the passivation film,
wherein the organic light-emitting diode further comprises:
an anode electrically connected to the thin-film transistor, wherein the anode is in a same layer as the connecting terminal,
an organic emission layer over the anode in the light emitting area, and
at least the part of the cathode electrode stacked on the organic emission layer.

9. The organic light-emitting diode display of claim 8, further comprising:
a buffer layer that covers the light shielding layer and the auxiliary line and disposed under the insulating film; and
wherein the thin-film transistor includes a drain electrode on the insulating film, and
wherein the auxiliary cathode is disposed on the insulating film in a same layer as the drain electrode.

10. The organic light-emitting diode display of claim 1, wherein a side surface of the auxiliary cathode contacts the connecting terminal, and the cathode electrode contacts the connecting terminal.

11. The organic light-emitting diode display of claim 1, wherein the auxiliary line, the auxiliary cathode, and the connecting terminal are placed in a non-light emitting area surrounding the light-emitting area, wherein the organic light-emitting diode in the light-emitting area and the auxiliary line are electrically connected.

12. An organic light-emitting diode display comprising:
a thin-film transistor on a substrate;
an organic light-emitting diode in a light-emitting area of the substrate, the organic light-emitting diode including at least a part of a cathode electrode;
an auxiliary line on the substrate;
an insulating film on the substrate;
an auxiliary cathode placed on the insulating film and electrically connected to the auxiliary line;
a passivation film on the substrate, at least a first part of the passivation film covering a portion of the auxiliary cathode; and
a connecting terminal on the passivation film that contacts an undersurface of the auxiliary cathode, that faces the substrate and is electrically connected to the cathode electrode.

13. The organic light-emitting diode display of claim 12, wherein a first opening in the insulating film and a second opening in the passivation film exposes an end portion of the auxiliary cathode extending beyond the first part of the passivation film.

14. The organic light-emitting diode display of claim 12, further comprising a dummy connecting terminal that makes direct contact with the connecting terminal on the undersurface.

15. The organic light-emitting diode display of claim 14, wherein the insulation film is formed with a contact hole to form the first part of the insulation film and a second part of the insulation film adjacent to the first part of the insulation film, and wherein at least another part of the cathode electrode extends to cover a side surface of the second part of the insulation film and contacts the dummy connecting terminal.

16. The organic light-emitting diode display of claim 12, further comprising an organic emission layer disposed between the connecting terminal and the cathode electrode, wherein the organic emission layer does not contact the auxiliary cathode.

17. The organic light-emitting diode display of claim 12, further comprising:
a planarization layer disposed on the passivation film, and
a bank layer disposed on the planarization layer,
wherein the connecting terminal covers a side surface of the planarization layer and at least a portion of the connecting terminal is disposed between the planarization layer and bank layer.

18. The organic light-emitting diode display of claim 12, further comprising:
a light shielding layer on the substrate in a same layer as the auxiliary layer; and
a thin-film transistor on the light shielding layer disposed under the passivation film,
wherein the organic light-emitting diode further comprises:
an anode electrically connected to the thin-film transistor, wherein the anode is in a same layer as the connecting terminal,
an organic emission layer over the anode in the light emitting area, and
at least a part of the cathode electrode stacked on the organic emission layer.

19. The organic light-emitting diode display of claim 18, further comprising: a buffer layer that covers the light shielding layer and the auxiliary line and disposed under the insulating film; and
wherein the thin-film transistor includes a drain electrode on the insulating film, and
wherein the auxiliary cathode is disposed on the insulating film in a same layer as the drain electrode.

20. The organic light-emitting diode display of claim 12, wherein the auxiliary line, the auxiliary cathode, and the connecting terminal are placed in a non-light emitting area surrounding the light-emitting area, wherein the organic light-emitting diode in the light-emitting area and the auxiliary line are electrically connected.

* * * * *